United States Patent

Sullivan et al.

[11] Patent Number: 6,163,758
[45] Date of Patent: Dec. 19, 2000

[54] DETECTION OF UNUSUAL WAVEFORMS

[75] Inventors: Steven K. Sullivan; Paul M. Gerlach, both of Beaverton, Oreg.

[73] Assignee: Tektronix, Inc., Beaverton, Oreg.

[21] Appl. No.: 09/092,669

[22] Filed: Jun. 5, 1998

[51] Int. Cl.[7] ............................. G09G 5/36; G06F 15/00
[52] U.S. Cl. ............................. 702/66; 345/134; 345/147
[58] Field of Search ............................. 702/66; 345/134, 345/146, 147, 157; 704/1, 275; 714/43

[56] References Cited

U.S. PATENT DOCUMENTS

| | | | |
|---|---|---|---|
| 4,504,827 | 3/1985 | Hanson et al. | 345/502 |
| 4,940,931 | 7/1990 | Katayama et al. | 324/121 R |
| 5,254,983 | 10/1993 | Long et al. | 345/147 |
| 5,387,896 | 2/1995 | Alappat et al. | 345/147 |
| 5,530,454 | 6/1996 | Etheridge | 345/134 |
| 5,666,545 | 9/1997 | Marshell | 710/227 |
| 5,986,637 | 11/1999 | Etheridge et al. | 345/134 |
| 5,999,895 | 12/1999 | Forest et al. | 704/1 |
| 6,005,549 | 12/1999 | Forest et al. | 345/157 |

*Primary Examiner*—Kamini Shah
*Attorney, Agent, or Firm*—Boulden G. Griffith; Thomas F. Lenihan

[57] ABSTRACT

Unusual waveforms are defined in terms of how many "new" pixels are affected by the process of rasterizing them. New pixels can be those not yet affected by the rasterization of any waveform in the current set of acquisitions, or to be those that have had higher values in their raster memory location but have now been decayed to below a defined value. Once detected, such waveforms can be re-rasterized with extra intensity or into a different color by using a reserved range of values of those storable in the raster memory. Alternatively, the special region of values can be used as a counter/timer to maintain the pixels associated with unusual waveforms at a brightest intensity value, or in the color equivalent, for an extended period of time. User input can be used to affect the definition of "new" pixels and to control the special persistence given to unusual waveforms. Unusual waveforms can also be saved in long term memory. Multiple decay functions and regions of values in the raster memory locations can be used as described above, or to produce a fast rate of decay in a bright visible region and a user adjustable slower rate of decay in a dimmer region, thus making recently acquired waveforms look bright and "lively", while older waveforms appear to be relatively gray and stable. The same techniques can be employed when color is used either along with or as a substitute for intensity variations.

23 Claims, 3 Drawing Sheets

DETECTION OF UNUSUAL WAVEFORMS

FIELD OF THE INVENTION

This invention relates to the definition and detection of unusual waveforms acquired by a digital oscilloscope, and more particularly to the controllable definition and automatic detection of such waveforms.

CROSS-REFERENCE TO RELATED APPLICATIONS

[not applicable]

STATEMENT REGARDING FEDERALLY SPONSORED RESEARCH AND DEVELOPMENT

[not applicable]

BACKGROUND OF THE INVENTION

Digital oscilloscopes generally use raster scan displays to present the activity of electrical signals to their users. Each raster scan display, such as those seen every day on computer screens, consists of a two dimensional array of pixels, with each pixel location being uniquely defined by a row number and column number. The simplest and lowest cost versions of such displays are "single bit" displays, in that the memory from which they derive the information to be displayed only has one bit of intensity information associated with each pixel. In such a display that single bit of information determines whether the pixel associated with it is either "on" or "off", with "on" dictating that a predetermined amount of intensity is to be used to illuminate the pixel and "off" indicating that the pixel is not to be illuminated at all.

The more complex and expensive alternative to a single bit display is a multi-bit display, which can provide variable intensity (also known as "gray-scale") or color variations as a substitute indicator of brightness. The memory locations associated with each pixel of a variable intensity display contain multiple bits of intensity information, indicating the number of varying intensity levels with which they can be illuminated. Like the pixels of single bit displays, those of multi-bit displays can exhibit an "off" or dark state, but instead of one value of illumination, they have multiple values. Typically, the number of values available is $2^N-1$, where N is the memory depth at each address of the raster memory. Thus, for example, a four bit deep raster scan memory can support fifteen levels of partial through maximum illumination, as well as the dark or "off" state. Pixel intensity can also be translated into differing colors, as well as intensity or "brightness".

With this larger amount of data, multi-bit displays can convey more information about the behavior of electrical signal waveforms under observation, particularly if the signal is not perfectly repetitive and therefore has less activity in some portions than others. U.S. Pat. No. 4,940,931 to Katayama et al. for "Digital Waveform Measuring Apparatus Having A Shading-tone Display", hereby incorporated by reference, describes a system for producing digital variable intensity displays.

Typically, digital oscilloscopes acquire information about the behavior of a circuit node by periodically sampling the voltage present at the node. The oscilloscope probe tip is placed in contact with the node and the probe and front end of the oscilloscope precisely replicate the signal, or some predetermined fraction or multiple of the signal, and present it to an analog-to-digital converter. The output of the analog-to-digital converter is a series of multi-bit digital words that are stored in an acquisition memory. Successively acquired samples are stored at sequentially related addresses in the acquisition memory, and are thereby related to a time scale. Those addresses will eventually be converted back to a time scale, one of which is represented as horizontal distance along the x-axis of the oscilloscope's raster scan display.

In a typical digital oscilloscope, voltage amplitude values derived from the data contents of an acquisition memory location determine the vertical location (row number) of an illuminated pixel, while time values derived from the addresses of the acquisition memory determine the horizontal location (column number). The process of expanding the contents and addresses of an acquisition memory to produce contents for a two dimensional raster memory is known as "rasterization".

Multi-bit intensity information also makes it possible to create analog-like "persistence" effects, i.e., the decay of signal intensity over time. In the older analog oscilloscopes, persistence was a decay of the illumination of the cathode ray tube (CRT) that was a function of the type of phosphor used in the construction of the CRT and the voltages applied to different elements of that tube. In digital oscilloscopes, a persistence decay function can be implemented by decrementing the intensity value associated with each illuminated pixel according to some algorithm. U.S. Pat. No. 4,504,827 to Hanson et al. for "Synthetic Persistence for Raster Scan Displays", hereby incorporated by reference, describes a method for pseudo randomly decrementing intensity data in a raster scan display. U.S. Pat. No. 5,254,983 to Long et al. for "Digitally Synthesized Gray Scale for Raster Scan Oscilloscope Display", hereby incorporated by reference, describes one approach for persistence-like decay of acquired waveforms stored as digital numbers. U.S. Pat. No. 5,387,896 to Alappat et al. for "Rasterscan Display with Adaptive Decay", hereby incorporated by reference, describes a system for rasterization that operates on a local pixel in one of two ways, depending on a calculation based on that pixel's initial value.

For many users, especially those having some experience with analog oscilloscopes, variable brightness usefully communicates information about the activity of the signal being observed. Many of these users have had a strong preference for some behaviors that resemble those of analog oscilloscopes. For example, as an analog oscilloscope generates vertical excursions during a horizontal sweep interval to provide a real-time picture of the signal activity at the probe tip, they inherently tend to vary the brightness of the display as an inverse function of the slope of the line they produce. This occurs because the cathode electron gun of the CRT generates a constant supply of electrons that depends on the setting of a "brightness" control, and the length of the trajectory covered in a unit of time is minimally determined by the x-axis distance associated with any particular sweep speed, but is increased by any and all y-axis excursions. And a y-aNis excursion can be a large multiple of the corresponding x-axis distance, so the constant available electron beam energy appears to be reduced by a large factor as it is spread over this much longer distance. Thus, analog oscilloscopes inherently vary the brightness of the line they draw as an inverse function of the slope of that line.

Another even more highly desired feature of an analog oscilloscope or a digital oscilloscope with a high waveform throughput, is the ability to detect an intermittent signal anomaly that occurs in an otherwise repetitive signal. Older digital oscilloscopes, with low "live time" make observing intermittent signal activity improbable, at least in the absence of special trigger modes designed to detect certain classes of intermittent signal activity. Analog oscilloscopes will show a faint trace indicating the presence of this intermittently anomalous signal behavior. Of course, if the signal becomes too intermittent, the trace will be so faint in brightness that it may be missed entirely by the oscilloscope operator.

With the persistence decay feature turned off, i.e., infinite persistence, a digital oscilloscope with single bit (on/off) intensity information will display rare or unusual waveforms with the same intensity as highly repetitive ones, i.e., "on". Digital oscilloscopes with multi-bit raster memories, and that therefore can provide variable intensity (or variable color) displays, allow for a visual distinction to be made between rare and repetitive waveforms. However, unless the persistence feature is turned off, these oscilloscopes may not illuminate truly rare events with enough intensity for a long enough period of time to allow the operator to notice, much less analyze, the intermittent activity.

Current oscilloscope products from assignee corporation, Tektronix, provide a means whereby the operator can distinguish between the most recent individual waveform acquisitions and older waveforms acquired previously. Both the TDS300 and TDS200 oscilloscopes use "off" and two levels of "on", with each level of "on" having different intensity levels. The most recently drawn waveforms are shown in the full level of "on" intensity, which is bright for the TDS300 series and black for TDS200 series oscilloscopes. The older "historical" waveforms are shown in lower, secondary intensity level (dim for TDS300, gray for TDS200). The historical information stays at that secondary intensity level for the entire duration of an acquisition series or for a preselected persistence time. (The term "acquisition series" as used in this document refers to a sequence of individual waveform acquisitions taken at the same settings over time in response to a series of separate triggers. A single or individual "acquisition" refers to one waveform record taken in response to a single trigger.

A simplified form of persistence mode has been included even in these relatively low-cost digital oscilloscopes to facilitate the collecting of signal history on a single screen. Even a simplified version can be quite helpful in locating glitches or other rare events. The TDS300 uses a simple collect and erase form of persistence, all done in one display plane. The user sets the desired persistence time, p, in seconds, and the oscilloscope collects the rasterized results of individual waveform acquisitions onto the same display plane for that amount of time. As the time p passes, the latest acquisition is displayed at full intensity, while all others are displayed at the other single level of reduced intensity. After the persistence interval p expires, the entire display plane is cleared and the same process is repeated. The disadvantage in this approach is that at any particular time, t, within the persistence interval p, the currently viewable history is only a maximum of the user's selected time interval, i.e., t modulo p. Information collected near the end of the interval disappears before it can be analyzed, and just after the display screen has been cleared no history information is visible at all.

The TDS200 uses a somewhat superior, multi-plane collect and erase model. Instead of collecting individual waveform acquisitions into a single display plane and then erasing it and using it again, it collects individual waveform acquisitions into one of N separate display planes for a selected time p. It ORs all N display planes to produce the display. Every p/N seconds the oldest display plane is cleared, and the next set of acquisitions are then collected into the newly cleared plane. This approach is superior, because at any given time, t, a history of (p−p/N+(t mod p/N)) seconds can be seen by the user. The most recent plane is displayed at the maximum level of intensity, while the other ORed planes are displayed at the single other reduced level of intensity.

What is desired is a way to define and detect unusual waveforms acquired by a digital oscilloscope, and preferably in a way that allows the definition of an unusual waveform to be controlled by the operator while the detection of the waveforms is then automatically performed by the oscilloscope.

BRIEF SUMMARY OF THE INVENTION

According to one aspect of the invention, unusual or anomalous waveforms are automatically distinguished from more normal, highly repetitive waveforms by the number of new pixels that they affect. "New" pixels can be variably defined to mean those pixels that have never been previously touched by any waveform since the beginning of the present acquisition series, or those which have not been affected for some interval of time as measured by the decay of values stored in a raster memory. User input can affect the definition of unusual waveforms by affecting the definition of "new" pixels and by affecting the decay rate applied to the values stored in the raster memory, values which can be used to measure the passage of time as well as the intensity or color of particular pixels in the display.

According to another aspect of the invention, automatically discovered unusual or anomalous waveforms are highlighted with extra brightness or by the use of a different color, thereby making it easier for the oscilloscope operator to notice them. The pixels of the unusual waveform can also be emphasized by giving them a high level of intensity (or corresponding color) and then holding them at that high level of intensity (or corresponding color) for a relatively long period of time. In another form of reaction, the detection and display of a single unusual waveform, or of a specified number of such waveforms within a predetermined time interval, stops further individual acquisitions in the current series of acquisitions and "freezes" the display for operator analysis. In yet another alternative, all waveform acquisitions containing unusual or anomalous waveform behavior are saved to at long-term waveform storage area for future examination by the oscilloscope operator, or for further analysis by the operator or by analysis software, while the acquisition series continues.

According to another aspect of the invention, the overall range of values that can be stored in a raster scan memory for translation into pixel intensities (or their corresponding colors) is segmented into two or more regions, each having associated with it a different persistence decay function. Which persistence decay function is applied depends on which region the pre-decay intensity value lies in. Multiple decay functions can serve a variety of uses. In one approach, the top and bottom levels have slower decay rates than the middle one, and the top one is reserved for use with unusual waveforms. The top level or bottom level or both can be made invisible in the actual display, but still function as timer/counters. The bottom level can operate as a counter/timer in the process of sorting pixels into the "new" and "old" categories by providing a way to tell which pixels have experienced relatively recent activity. The top level can operate as a counter/timer to specify the length of time that a pixel that is part of an unusual waveform should be kept at maximum brightness or be shown in the color corresponding to maximum brightness in color displays. Different regions of values in the raster memory and their differing decay functions can also be used to cause intensities in the top region to decay relatively rapidly, while intensities in the bottom region are caused to decay much more slowly. This can provide an adjustable and relatively lengthy period for historical waveforms to fade gradually away while they go from nominal brightness to barely discernable brightness. A middle level can be used to smooth the transition between the top and bottom levels.

DETAILED DESCRIPTION OF THE INVENTION

Figure 1:
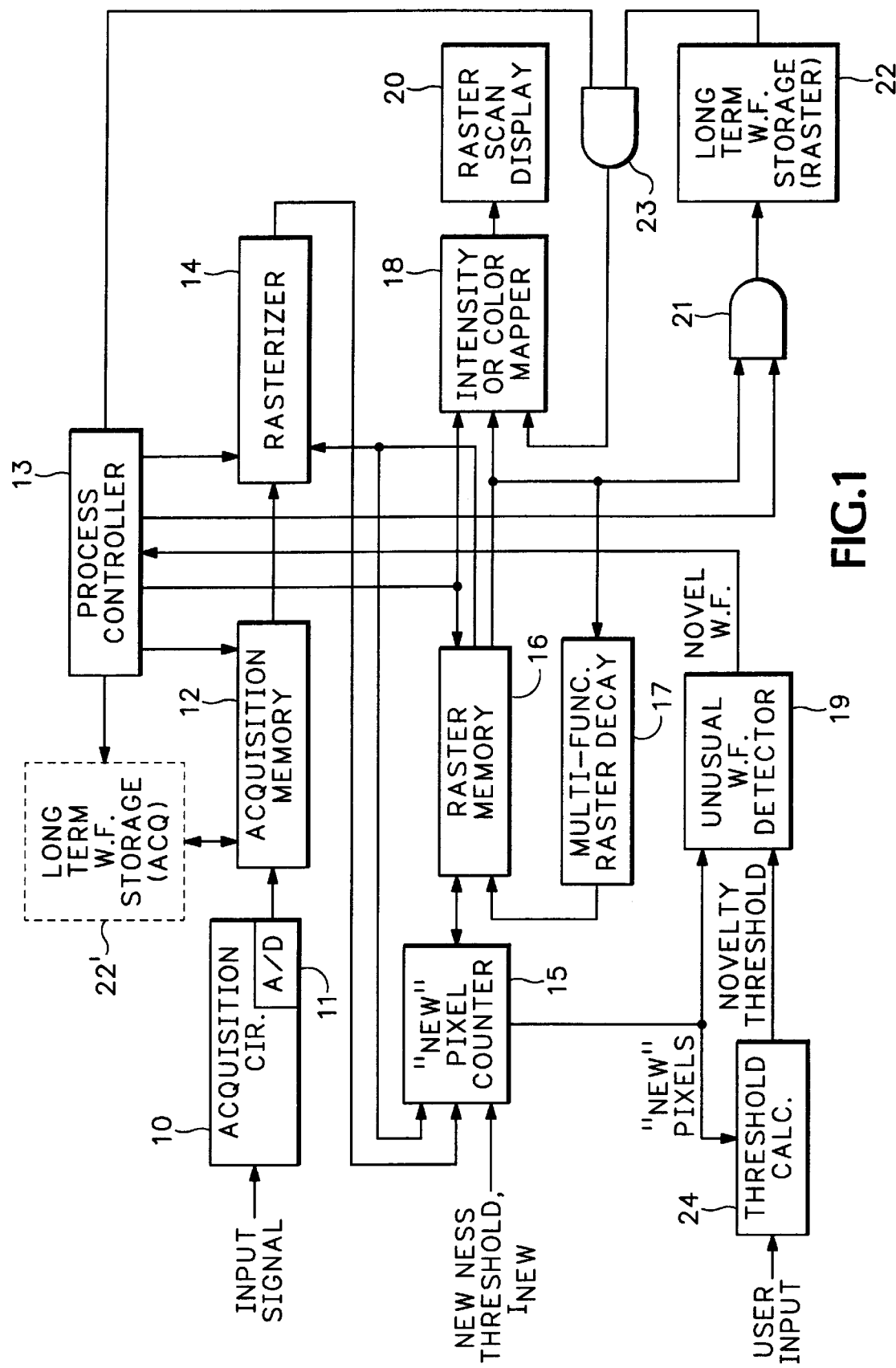
FIG. 1 is a conceptual block diagram showing how the present invention may be implemented in conjunction with conventional digital oscilloscope acquisition, rasterization, and display functions.

Referring first to FIG. 1, it should be noted that this is a conceptual block diagram only, and that various parts of it could be implemented in either hardware or software, or could be made to function or interoperate differently, without departing from the broad idea of the several inventions discussed below.

Acquisition circuitry 10 tracks and periodically samples an input signal being monitored by the oscilloscope of which all of the circuitry, or its software substitute, shown in FIG. 1 is a part. Analog-to-digital converter 11 produces as its output a stream of binary values describing the amplitude of the input signal tracked by the acquisition circuitry. These amplitude values are stored at sequentially related addresses in the acquisition memory 12. The resulting data-address pairs are subsequently sent to rasterizer 14 according to directions from the process controller 13.

The rasterizer 14 converts a single data-address pair into a dot or converts a sequential pair of data-address pairs into a vector, mapping the resulting points into a two-dimensional array of rows and columns that will eventually be displayed on raster display 20. The rasterizer 14 typically operates on one column of the raster at a time, performing read-modify-write operations on each memory location in the raster memory 16 that is affected by the current dot or vector being generated. Further information regarding details of the alternatives available for the operation of this circuitry is available in co-pending U.S. patent application Ser. No. 09/026,185, for "Sparse Vector Rasterization", filed Feb. 19, 1998, hereby incorporated by reference.

The process controller 13 operates to coordinate the activities of the acquisition memory 12, the rasterizer 14, and the raster memory 16, in any one of a number of manners that are well known in the prior art, and additionally performs new functions in accordance with several aspects of the present invention. The "new" pixel counter 15 is itself new and operates in accordance with the present invention as will be further described below. The multi-function raster decay 17 is a modified version of prior art single-function raster decay generators. Similarly, the intensity or color mapper 18 is a variation on earlier circuitry, but adapted for use in accordance with the present invention. The threshold calculator 24 and the unusual waveform detector 19 are also new and part of one or another aspects of the present invention. Long term waveform storage memories, both raster memory version 22 and acquisition record memory version 22' are available in the prior art, but operated differently here in accordance with one or another aspects of the present invention.

According to one aspect of the present invention, the "new" pixel counter 15 keeps track of how many pixels that are being "hit" by this waveform rasterization pass have never been hit before within the present series of waveform acquisitions. This approach can be implemented by the use of a one bit pixel map dedicated to keeping track of all pixels that have ever been used. Such a single bit pixel map could be implemented by the use of a reserved bit in the main raster memory.

In another embodiment of the same aspect of the invention, the "new" pixel counter 15 keeps track of how many pixels that are being hit during this waveform rasterization pass have less than a minimum newness threshold value stored in their raster memory location. In the latter embodiment, the determination of whether a pixel is "new" or not is made by examining the value read out of the raster memory 16 as the rasterizer 14 performs read-modify-write operations. If the value read out of the raster memory 16 is less than a newness threshold value, then the associated pixel is counted as being "new". The newness threshold value can be zero or positive, and the value from the memory location can have reached a value equal to or less than it in a variety of ways. For example, that location could have never been affected by a previous waveform in this series of acquisitions and therefore still be zero. Or, it could have been hit "lightly" and infrequently, and subsequently undergone a small number of decay cycles until its value became lower than the threshold value. Or, it could have been hit "heavily" many times and subsequently undergone a large number of decay cycles to reach the low level below the threshold value. Or, it could have undergone some mixture of the latter two possibilities and eventually ended up below the threshold value as the result of a somewhat "random walk" of additions and subtractions over time. Thus, while the detection of a new pixel means that it has not been affected for some length of time, that amount of time can be highly variable.

As will be further described below, the intensity or color mapper 18 may be programmed to map raster location stored values below a certain threshold into zero intensity values in the raster scan display 20. This will typically be done in conjunction with the use of a multi-function raster decay generator 17, the operation of which will also be described in further detail below. In this mode of operation, the minimum value added by the rasterizer 14 to indicate a "hit" will be larger than the predetermined number of recent cycles desired. Adding values greater than such a minimum value permits the use of some of that value to produce visible raster decay cycles and the remainder to be used in "invisible" decay cycles that serve a counter/timer function without causing illumination on the display. Values in the invisible region are all mapped to zero intensity by intensity or color mapper 18. This, and other, uses of the multi-function raster decay generator 17 are further described in detail below.

It should be noted that in some implementations, in particular those that only have a single display plane and supporting raster memory, the use of an "invisible" region can add undesired complications. In particular, if multiple waveforms are being drawn in a single plane according to a priority scheme whereby lower priority waveforms are overwritten by higher priority waveforms, and nothing is done to treat the invisible regions as a special case, the invisible regions in the top priority waveform can lead to blank areas in the underlying waveforms which would otherwise show through in those areas.

It should also be noted that some raster scan displays 209 produce dark waveforms on a light background. Therefore, the expression "zero intensity" as used throughout this document, including the claims, may be intended, if applied to this type of display, to mean the lightest possible value in the display instead of the darkest.

After each waveform rasterization, the "new" pixel counter 15 provides the number of "new" pixels to the threshold calculator 24 and to the unusual waveform detector 19. The threshold calculator 24 may or may not utilize user input in formulating a novelty threshold that it provides to the unusual waveform detector 19. The unusual waveform detector 19 compares the "new" pixels information that it receives from the "new" pixel counter I! with the novelty threshold that it receives from the threshold calculator 24 and by comparing them determines if a novel waveform appears to be present. If so, an active novel waveform signal informs the process controller 13 of this event.

The presence of an active novel waveform input to the process controller 13 causes it to take several actions, some of which may depend on user choices. It can cause the re-rasterization of the unusual waveform using maximum intensity values. "Maximum" here can mean any one of several things or their combination. One meaning of maximum is simply to use the highest value of pixel intensity that is normally used. Another meaning is to use a "super-maximum", a value that is at the top of a region of values that are all brighter than those values used for displaying normal waveforms. Another meaning of "maximum" can be to switch from dots to vectors, so that many more pixels are illuminated, as well as illuminating those pixels with a maximum intensity according to either one of the above definitions. Yet another meaning of "maximum" can be to switch from vectors defined by illumination of a subset of their possible dots, to vectors illuminated by more or all of their possible dots.

In addition to, or instead of, increasing the intensity of the unusual waveform, the process controller 13 can cause the acquisition memory 12 to provide the data record that produced the unusual waveform to long term waveform (acquisition) storage memory 22'. Alternatively, the process controller 13 can cause the raster memory 16, via AND gate 21, to provide the raster memory image containing the unusual waveform to long term waveform storage (raster) memory 22. It can also store the waveform both ways, if so desired. Generally, it will be desirable to re-rasterize and maximally brighten an unusual waveform before storing it in the long term raster waveform storage 22. The process controller 13 can also stop further acquisitions and "freeze" the display, particularly after having the unusual waveform re-rasterized with maximum brightness.

The threshold calculator 24 can be controlled or preprogrammed to respond to the beginning of a new series of acquisitions by first ignoring an initial set of "new" pixels data, that data being from the first waveforms rasterized in the new series of acquisitions, and then saving the "new" pixels data associated with a typical sample set of waveform rasterizations. The purpose of discarding the data associated with the first waveforms is based on the knowledge that they will have many more "new" pixels than later, more typical waveforms, because they are being drawn over a relatively blank display. Once this initial suspect data has been discarded, and enough "usual" waveforms have been used to define a typical number expected "new" pixels per waveform, this data can then be used to calculate a mean and a standard deviation from that mean, and those values can then be used to form a. suitable novelty threshold value for sending to the unusual waveform detector 19.

Other algorithinic approaches could process the data from the set of usual waveforms and the user input differently, but still produce a satisfactory novelty threshold. User input to the threshold calculator 24 can be used to affect the novelty threshold in a number of ways. It can directly set it. It can determine the size of the initial set of waveforms to be discarded, and/or the size of the set of typical waveforms used to calculate the mean and standard deviation. Or, it can be used to determine how many standard deviations, or fractions thereof, from the mean should be considered "normal" in determining the value of the novelty threshold. Or, it can be used to affect some parameter of some other algorithm (than mean and standard deviation) for characterizing "normalcy" and determining the novelty threshold. By one means or another, the user input can be adapted to control the novelty threshold to answer the question: "How many 'new' pixels does it take to make a waveform unusual?"

Figure 2A:
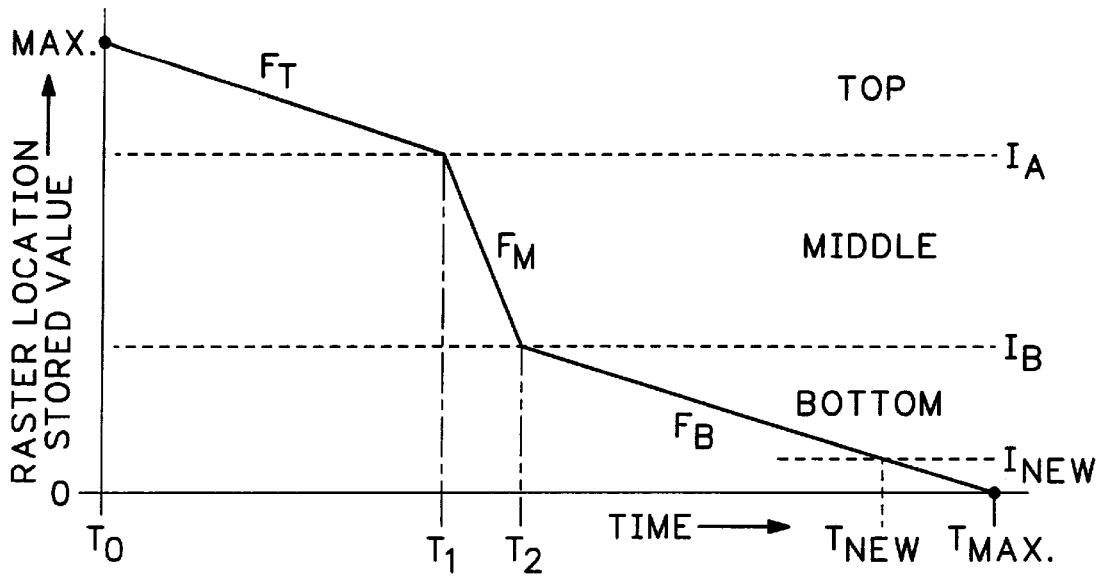
FIG. 2A is an illustration of three persistence decay functions operating over three regions of the range of possible values stored in raster memory locations; values that will eventually be mapped into various intensity levels or color choices for display.

Referring next to FIG. 2A, we see illustrated intensity-related values stored in locations of raster memory divided into three regions, with each region having an independent simple decay function. Throughout the following discussion, and in the claims at the end of this application, we will refer to "different decay functions", with the qualification "simple" implied. It is understood that two or more such simple different decay functions could be combined into a more complex decay function having different properties over different regions, but it is our intent to equate and translate any such complex decay function into multiple simple different decay functions for the purpose of describing and claiming them herein.

The TOP region, above the intensity threshold $I_A$ and up to the MAXimum value that can be stored in a pixel location, can be reserved for illuminating unusual waveforms, and the maximum intensity used for normal, i.e., "usual", waveforms can be limited to a maximum of $I_A$. However, since the total dynamic range of intensity is a scarce commodity in communicating signal activity to the operator, all of the values in the TOP range can be compressed and mapped (18 in FIG. 1) to the maximum intensity value actually displayed on the raster scan display (20 in FIG. 1). This approach uses the TOP range and its decay function $F_T$ as a counter/timer creating a duration of time during which the mapped pixel intensity will remain at it maximum value.

To extend the period of time during which the mapped pixel intensity will remain at or near maximum, the decay function, $F_T$, for the top region can also be made to provide a slow rate of decay, as shown in FIG. 2A, so that unusual waveforms are not only given maximum brightness, but tend to stay that way for a significantly longer amount of time, i.e., from $T_0$ to $T_1$. In contrast, the more numerous usual waveforms not only start out less bright, but also decay in brightness more quickly, i.e., from $T_1$ to $T_2$, according to the decay function, $F_M$, used in the MIDDLE region. However, this lesser level of maximum brightness is compensated for by how relatively numerous the hits associated with normal waveforms are. The unusual waveforms, because they are by definition relatively rare, need to be brighter and decay more slowly in order to stand out enough to be adequately perceived by the oscilloscope operator.

It should be noted that in many oscilloscope display designs, e.g., some of those described in co-pending U.S. patent application Ser. No. 09/026,185, for "Sparse Vector Rasterization", filed Feb. 19, 1998 and incorporated by reference above, the maximum value added to the number stored in the rasterization memory by a particular rasterization cycle is never as large as the maximum amount that can be held in such a location. This means that in order to reach the actual maximum value that can be held by a location, repetitive waveforms must keep hitting that pixel nearly continuously for some period of time. Such a buildup of multiple "hits" on the same pixel can be limited to a maximum of the level $I_A$, while the TOP region is reserved for acting as a timer for keeping the pixels associated with unusual waveforms at the same brightness produced by a value at or nearly equal to the same maximum intensity level, that mapped from $I_A$.

The BOTTOM region in FIG. 2A, that region of raster location-stored intensity-related values below the threshold $I_B$, can be decayed by a relatively slow function, $F_B$, to provide a relatively gray historical background that fades very slowly. The pixels associated with raster memory locations containing intensity-related values above the newness threshold $I_{NEW}$, can be treated as "old" and not counted as "new pixels" until the stored value in their location decays to some value below $I_{NEW}$. Of course, $I_{NEW}$ can also be set to zero. Either way, the time $T_{NEW}$ associated with the decay to the level $I^{NEW}$ is the time that a pixel identified as having recently been used and therefore does not qualify as a "new pixel".

The intensity or color mapper 18 in FIG. 1 can also map values other than zero to be the minimum intensity value on the raster scan display 20. For example, $I_B$ or some other value between $I_b$ and $I_{NEW}$ could be the value that is mapped to zero intensity (along with all lesser values). The portion of the BOTTOM region between the value mapped to zero and the value assigned to $I_{NEW}$ would then provide a counter/timer function to determine when a particular pixel makes the transition back to "new", but would be invisible to the operator.

Figure 2B:
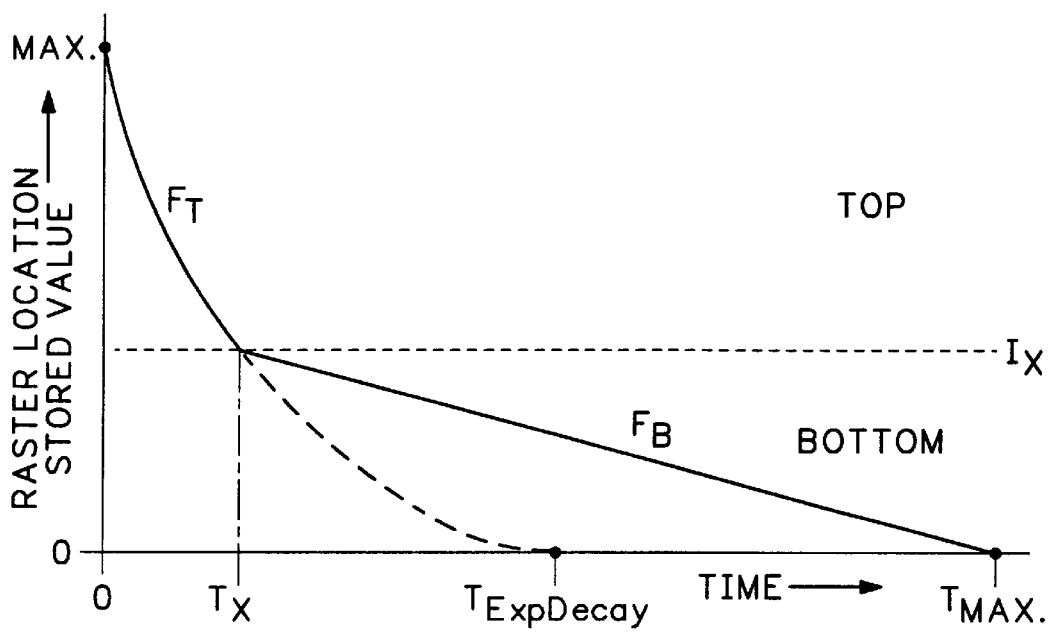
FIG. 2B is an illustration of two persistence decay functions operating over two regions of the range of possible values stored in raster memory locations. The top decay function is exponential and relatively rapid, while the bottom one is linear and relatively slow.

Referring now to FIG. 2B, this is an illustration of a very different way to use multiple persistence decay functions and regions. Here we have only two regions of stored intensity-related values, TOP and BOTTOM, and their associated decay functions, $F_T$ and $F_B$. In this case, the TOP decay function $F_T$ is a relatively rapid exponential function, while the linear decay function $F_B$ used in the BOTTOM region is relatively slow. All new waveforms, whether normal or "unusual" are mapped into some part of the TOP region, where they will decay relatively fast. The only way that intensity-related values in the BOTTOM region are reached is by decay from the TOP region. Thus, when this approach is used, new waveforms drawn into the TOP region appear bright and "lively" until they decay into the BOTTOM region, where their values represent less intensity and they become part of a somewhat gray and slowly fading historical background. The same effect can be achieved with colors and combinations of colors and intensities. This allows the user to identify and evaluate the quickly changing most current waveforms, while at the same time viewing a history of older waveforms. The use of only two colors, one for intensity values in the TOP region and another for intensity values in the BOTTOM region, is also useful and aesthetically satisfying if suitable colors are selected. For example, yellow can be used for the bright active TOP region while orange is used for the lower intensity less active historical BOTTOM region.

Figure 2C:
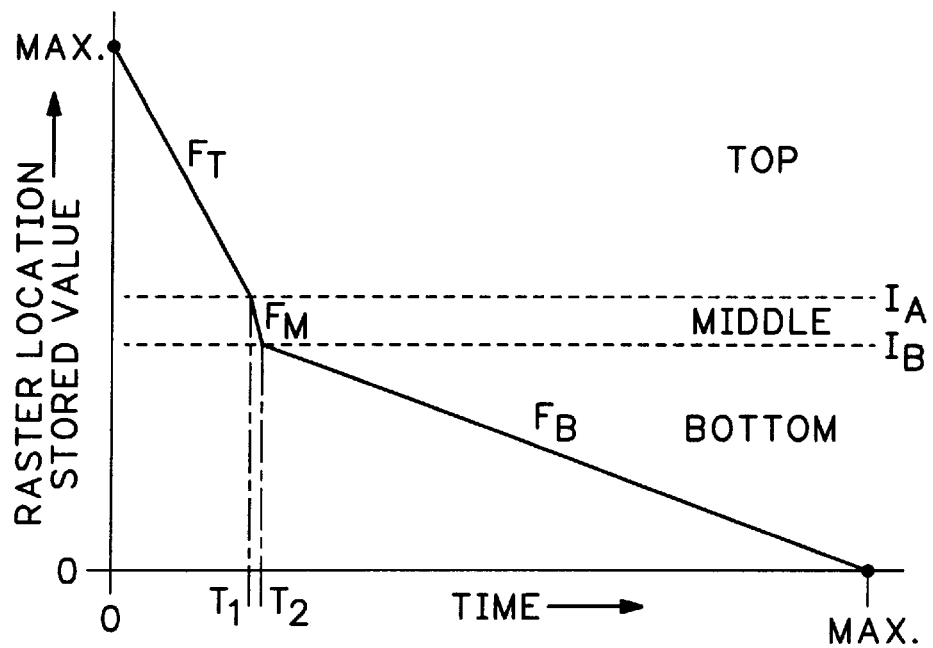
FIG. 2C is an illustration of three persistence decay functions operating over three regions of possible values stored in a raster memory locations, with the middle decay function acting as a transitional one between the top one and the bottom one.

In the example above, where there is only a TOP and BOTTOM region, there is a small problem that can be corrected by slightly separating $I_A$ and $I_B$ to create a third, or MIDDLE region as is shown in FIG. 2C. The problem with the two region approach is that there is a minimum increment of decay that is related to the steepness of the slope of the decay for the TOP region. When the TOP region is contiguous with the BOTTOM region, this minimum increment of decay sometimes moves the next incremental value well into the BOTTOM region instead of merely to the top of it. How much this occurs depends on the size of the minimum increment of decay and how close the starting point is to the line separating the TOP and BOTTOM regions. Because it has been noted that the visual effect of this overshoot produces a small artifact in the display, a MIDDLE region is created to act as a buffer between the TOP and BOTTOM regions.

The separation between $I_A$ and $I_B$ is chosen to equal this minimum increment of decay produced by the decay function FT used in the TOP region. In FIG. 2C this decay function $F_T$ is linear but fast, and therefore produces a result that is not very different from the fast exponential decay function $F_T$ used in the TOP region of the range shown in FIG. 2B. The MIDDLE region, i.e., the separation between $I_A$ and $I_B$, only needs to be the size of the minimum increment of decay produced by $F_T$ in order to guarantee that decaying TOP values decay into the MIDDLE region instead of into the BOTTOM region. Then, all decays in the MIDDLE region produced by the decay function $F_M$ are made to result in the next value being equal to the value $I_B$. This eliminates any visual artifact and is one way to smooth the transition between the TOP and BOTTOM regions. For two-color coding purposes, the MIDDLE region is preferably given the same coloration as the TOP region.

Since all values in the MIDDLE region decay to $I_B$, the bottom of the MIDDLE region and top of the B0TTOM region, the maximum time that any pixel takes to decay through the middle region is $T_2$ minus $T_1$, which is then equal to the time needed for one raster decay cycle.

The user can be given control over the faster exponential decay function $F_T$ used in the TOP region. This allows control over the amount of time that newly acquired waveforms appear as bright and lively. The user can also be given control over the slower persistence decay function FB associated with the BOTTOM region. This allows control over how much historical data appears in the background created by the lower intensity and/or different color associated with the region of values between $I_B$ and true zero.

Figure 2D:
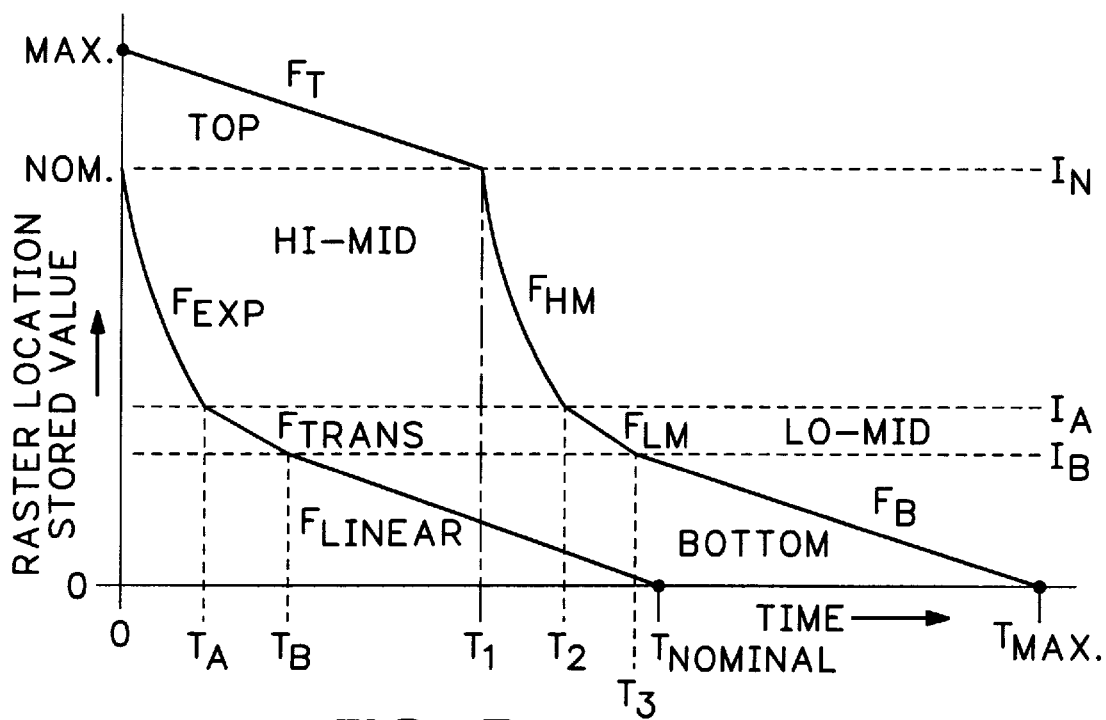
FIG. 2D is an illustration of four persistence decay functions operating over four regions of the range of possible values stored in raster memory locations. The top decay function is slow and linear, the next one rapid and exponential, the third one of intermediate speed is linear and transitional, while the forth function is again relatively slow and linear. The rapid exponential, the transitional linear, and the bottom slow linear decay functions are shown a second time at the left, with their activity not preceded by the decay time of the first function reducing values through the top region.

Referring finally to FIG. 2D, we see an illustration of four persistence decay functions operating over four regions of the range of possible intensity-related values stored in raster memory locations. The TOP decay function $F_T$ is slow and linear. The next region, the HI-MIDDLE one, has a decay function $F_{HM}$, (labeled $F_{EXP}$ on the left) that is rapid and exponential. The next region, the LO-MIDDLE one, has a decay function $F_{LM}$ (labeled $F_{TRANS}$ on the left) of intermediate speed that is linear and transitional. The BOTTOM region, which has a decay function $F_B$ (labeled $F_{LINEAR}$ on the left) that is again relatively slow and linear. The versions of these functions shown on the left, rapid exponential, $F_{EXP}$, the transitional linear, $F_{TRANS}$, and the bottom linear, $F_{TRANS}$, decay functions, illustrate how and why the total nominal time, $T_{NOMINAL}$, is different when values are originally drawn into the top of the HI-MIDDLE region at the NOMinal maximum at $I_N$ instead of the MAXimum at the top of the TOP region. $T_o$ to $T_A$ is equal to $T_1$, to $T_2$, $T_A$ to $T_B$ is equal to $T_2$ to $T_3$, and $T_B$ to $T_{NOMINAL}$ is equal to $T_3$ to $T_{MAX}$. Also, $T_{MAX}$, the total decay time for an original entry at the MAXimum intensity-related value that can be stored in the raster memory (the top of the TOP region), is equal to $T_{NOMINAL}$, the total decay time for an original entry at the NOMinal value at the top of the HI-MIDDLE region, plus $T_0$ to $T_1$., the time required to decay through the TOP region according to $F_T$. The latter time, $T_0$ to $T_1$., the time required to decay through the TOP region according to $F_T$, is the extra time that pixels associated with unusual waveforms are held to the maximum level of brightness if the TOP region is only used as a counter/timer and all. intensity-related values within it are mapped to the maximum value of raster scan display screen intensity, the same value that $I_N$ is mapped to.

Also, it should be noted that the decay function $F_{TRANS}$ (a.k.a. $F_{LM}$) used in the LO-MIDDLE transitional region (values between $I_A$ and $I_B$) of FIG. 2D is not the same as the transitional function $F_M$ used in the MIDDLE region of FIG. 2C, although it serves the same function. In FIG. 2D the transitional function $F_{TRANS}$ uses a slope that is intermediate to the slopes of the functions above and below it, $F_{EXP}$ and $F_{LINEAR}$, while the $F_M$ function in FIG. 2C operates on an entirely different principle, i.e., all points map to the end point.

As has been mentioned above, operator input can be used in a variety of ways to help determine the novelty threshold output of the threshold calculator 24 in FIG. 1. Operator input can also be used to determine or affect all of the transfer functions and/or the thresholds used to determine the boundaries between regions shown in FIGS. 2A–2D.

Depending on other values used in the implementation, linear slopes can be implemented by decremrenting by unity, decrementing by integers greater than unity, decrementing by power of two fractions, or decrementing by unity or a power of two fraction according to a probability function. The latter implements decrementing by numbers less than one or less than a particular fraction. It is accomplished by using a random number generator in conjunction with a threshold generator and a comparator. The threshold generator determines a probability by producing a threshold number, which is then compared with the output of the random number generator in order to determine whether the probability was satisfied or not. Exponential decays of varying rates can be accomplished by implementing $VALUE_{NEW} = VALUE_{OLD} * X/16$ iteratively and recursively, where X can be affected by operator input.

While a preferred embodiment of the present invention has been shown and described, it will be apparent to those skilled in the art that many changes and modifications may be made without departing from the invention in its broader aspects. For example, wherever the phrase "intensity-related values" is used, the phrase "color-related values" could be used instead or as well. The claims that follow are therefore intended to cover all such changes and modifications as are permitted by the patent laws of the respective countries in which this patent is granted.

What is claimed is:

1. A method for automatically detecting unusual waveforms during monitoring of a generally repetitive electrical signal by a digital oscilloscope, the method comprising the steps of:

determining a number of "new" pixels affected by each waveform rasterization process;

comparing the determined number of "new" pixels with a novelty threshold number of pixels; and if the determined number of pixels is less than the novelty threshold number of pixels, classifying that rasterized waveform as a normal waveform; or if the determined number of pixels is more than the novelty threshold number of pixels, classifying that rasterized waveform as an unusual waveform.

2. A method for automatically detecting unusual waveforms according to claim 1 further comprising the preliminary step of defining "new" pixels as pixels that have not been affected by any waveform rasterization in the current series of waveform rasterizations.

3. A method for automatically detecting unusual waveforms according to claim 2 further comprising the step of maintaining a single bit raster map or equivalent to keep track of those pixels that have been affected by any waveform rasterization in the current series of waveform rasterization.

4. A method for automatically detecting unusual waveforms according to claim 1 further comprising the preliminary step of defining "new" pixels as pixels that have raster memory location intensity-related contents below a newness threshold.

5. A method for automatically detecting unusual waveforms according to claim 4 wherein the newness threshold is zero.

6. A method for automatically detecting unusual waveforms according to claim 4 wherein the newness threshold is greater than zero.

7. A method for automatically detecting unusual waveforms according to claim 4 wherein the newness threshold is affected by operator input.

8. A method for automatically detecting unusual waveforms according to claim 4 wherein the raster memory location intensity-related contents are periodically decremented according to a decay function.

9. A method for automatically detecting unusual waveforms according to claim 4 wherein the raster memory location intensity-related contents are periodically decremented according to one of a number of decay functions, with each decay function being associated with a different region of a range of intensity-related values that the raster memory location is capable of storing.

10. A method for automatically detecting unusual waveforms according to claim 9 wherein the operative decay function from among the number of decay functions is determined by the intensity-related value contained in the raster memory location currently being processed.

11. A method for automatically detecting unusual waveforms according to claim 9 wherein the newness threshold is equal to a intensity-related value that is in a region all of whose intensity-related values are mapped to zero intensity for display.

12. A method for automatically detecting unusual waveforms according to claim 1, wherein the novelty threshold number of pixels is determined by a method that includes counting the number of pixels being affected for the first time in each of a sample set of waveform rasterizations.

13. A method for automatically detecting unusual waveforms according to claim 2, wherein the novelty threshold number of pixels is determined by a method that includes counting the number of pixels being affected for the first time in each of a sample set of waveform rasterizations.

14. A method for automatically detecting unusual waveforms according to claim 4, wherein the novelty threshold number of pixels is determined by a method that includes counting the number of pixels being affected for the first time in each of a sample set of waveform rasterizations.

15. A method for automatically detecting unusual waveforms according to claim 1, wherein the novelty threshold number of pixels is determined by a method that incorporates operator input.

16. A method for automatically detecting unusual waveforms according to claim 2, wherein the novelty threshold number of pixels is determined by a method that incorporates operator input.

17. A method for automatically detecting unusual waveforms according to claim 4, wherein the novelty threshold number of pixels is determined by a method that incorporates operator input.

18. A method for automatically detecting unusual waveforms according to claim 1, further comprising the step of reacting to the classification of a waveform as an unusual waveform by re-rasterizing that waveform with enhanced intensity.

19. A method for automatically detecting unusual waveforms according to claim 2, further comprising the step of reacting to the classification of a waveform as an unusual waveform by re-rasterizing that waveform with enhanced intensity.

20. A method for automatically detecting unusual waveforms according to claim 4, further comprising the step of reacting to the classification of a waveform as an unusual waveform by re-rasterizing that waveform with enhanced intensity.

21. A method for automatically detecting unusual waveforms according to claim 1, further comprising the step of reacting to the classification of a waveform as an unusual waveform by re-rasterizing that waveform with coding to produce a different color.

22. A method for automatically detecting unusual waveforms according to claim 2, further comprising the step of reacting to the classification of a waveform as an unusual waveform by re-rasterizing that waveform with coding to produce a different color.

23. A method for automatically detecting unusual waveforms according to claim 4, further comprising the step of reacting to the classification of a waveform as an unusual waveform by re-rasterizing that waveform with coding to produce a different color.

* * * * *